United States Patent [19]

Cazcarra et al.

[11] Patent Number: 4,637,123
[45] Date of Patent: Jan. 20, 1987

[54] METHOD OF STANDARDIZING AND STABILIZING SEMICONDUCTOR WAFERS

[75] Inventors: Victor Cazcarra, Mennecy; Jocelyne LeRoueille, Juvisy/Orge, both of France

[73] Assignee: International Business Machines Corporation, Armonk, N.Y.

[21] Appl. No.: 743,329

[22] Filed: Jun. 10, 1985

[30] Foreign Application Priority Data

Jun. 20, 1984 [EP] European Pat. Off. ........ 84430020.2

[51] Int. Cl.$^4$ .................... H01L 21/02; H01L 21/477
[52] U.S. Cl. ................... 29/569 R; 148/1.5; 148/DIG. 24; 148/DIG. 60; 148/DIG. 127
[58] Field of Search ...... 29/569 R; 148/1.5, DIG. 24, 148/DIG. 60, DIG. 127; 156/601, 617 SP

[56] References Cited

U.S. PATENT DOCUMENTS

| | | | |
|---|---|---|---|
| 4,314,595 | 2/1982 | Yamamoto et al. | 148/1.5 |
| 4,342,616 | 8/1982 | Elliott et al. | 156/601 |
| 4,344,815 | 8/1982 | Cazarra et al. | 156/617 SP |
| 4,417,943 | 11/1983 | Jacques et al. | 156/601 |

FOREIGN PATENT DOCUMENTS 0090329 10/1983 European Pat. Off. .

Primary Examiner—Brian E. Hearn
Assistant Examiner—John T. Callahan
Attorney, Agent, or Firm—T. Rao Coca

[57] ABSTRACT

Disclosed is a method of stabilizing and standardizing semiconductor wafers obtained from a plurality of vendor sources for use in both unipolar and bipolar device manufacturing lines. Based on measured initial oxygen concentration, the as-received wafers are grouped into lots. Next, based on measured oxygen precipitation rate of each lot, the wafer lots are grouped into classes, regardless of their vendor origin. Typically, the grouping consists of three classes corresponding to low, intermediate and high oxgen precipitation rate.

The wafers of each class are then subjected to a thermal adaptation cycle tailored to the class to generate in each wafer clusters of a concentration corresponding to a predetermined cluster concentration range and a defect-free zone corresponding to a predetermined defect-free zone range. The thermal adaptation cycle is different from class to class, but identical for wafers of a given class.

20 Claims, 5 Drawing Figures

METHOD OF STANDARDIZING AND STABILIZING SEMICONDUCTOR WAFERS

BACKGROUND OF THE INVENTION

This invention relates to the manufacture of semiconductor wafers and, more particularly, to a method of standardizing and stabilizing semiconductor wafers, so that they can be used in both unipolar and bipolar device production lines.

CROSS REFERENCE TO OTHER PATENT APPLICATIONS

Patent application Ser. No. 523,555, "Enhanced Low Leakage Field from Silicon Wafers Having Low Oxygen and High Carbon Concentration", by D. C. Ahlgren, J. L. Deines, E. W. Hearn, M. V. Kulkarni, F. J. Montillo, M. R. Poponiak and J. J. Wang, filed on Aug. 16, 1983 now abandoned.

It is well known that process induced defects and contamination cannot be completely eliminated during the manufacture of semiconductor integrated circuits. To overcome this difficulty, various techniques for gettering defects due to impurities and other contaminants have been developed in the prior art. One such technique is the internal gettering technique which utilizes the oxygen atoms present in supersaturated solid solution in the silicon by causing these atoms, during subsequent thermal treatment, to form small aggregates or precipitates. This phenomenon is attended by the generation of secondary defects such as stacking faults and/or dislocations. These precipitates and secondary defects constitute microdefects which act as nucleation sites that will be used for gettering impurities and contaminants. The effectiveness of this type of gettering is dependent upon the kinetics of precipitation of the oxygen atoms, which itself depends upon the initial concentration of the oxygen atoms and the distribution of the nucleation sites. The actual mechanism leading to these phenomena is not well understood at the present time. However, the prior art indicates that three requirements must be met in order to achieve the desired internal gettering effect. These are: (1) the initial concentration must be sufficiently high to allow a precipitation to occur; (2) a defect-free zone (DFZ) must exist on the surface of the wafer, particularly on the active surface thereof; and (3) nucleation sites (e.g., small clusters or agglomerates of oxygen atoms) must be present in the wafer.

The first of these requirements is readily satisfied since most commercially available silicon wafers are obtained from Czochralski-grown silicon rods and have an initial oxygen concentration in the range of 26–40 ppma which was found to be suitable for manufacturing purposes. (Ppma stands for parts per million atomic and corresponds to $0.5 \times 10^{17}$ atoms per cm$^3$ of silicon). Within this oxygen concentration range, it is known from U.S. Pat. No. 4,344,815 issued to V. Cazarra, A. Schwab and P. Zunino, and assigned to the present assignee, that the requirements of the wafers for bipolar device manufacture (e.g., npn transistor) and unipolar device (e.g., field effect transistor) manufacture are different. For bipolar device manufacture, the initial oxygen concentration in the wafer should preferably be in the range of 26 to 36 ppma whereas the concentration required to manufacture unipolar devices is preferably in the range of 30-40 ppma.

Formation of a defect-free zone is accomplished by taking advantage of the propensity of the oxygen atoms to diffuse out of the wafer at the top and bottom surfaces when the wafer is subjected to a heat treatment at a high temperature exceeding about 1000° C. During such heat treatment, the concentration of oxygen atoms nears the oxygen solubility limit within a zone of a few microns thick below the surface of the wafer. The solid solution is then stabilized since it is no longer supersaturated. During subsequent heat treatments, the oxygen atoms will precipitate in the bulk rather than at the surfaces of the wafer, thereby generating therein a superficial defect-free zone. The depth of the defect-free zone depends on the initial oxygen concentration and the temperature and time of the thermal cycle.

Focusing on the third requirement, it is known that nucleation sites or clusters are generated during a thermal anneal treatment performed at a lower temperature, typically below about 900° C. This low temperature anneal tends to reduce the supersaturation of interstitial oxygen nucleation by creating small clusters of oxygen atoms and is dependent on random fluctuations of the oxygen concentration.

The internal gettering processes satisfying the second and third requirements are illustrated by the curves of FIG. 1, which represent the dependence of the nucleation rate and the thickness of the defect-free zone on the temperature at which the heat treatment is performed.

Various attempts have been made to obtain a manufacturing method which conveniently combines these two processes. The sequence in which the operations are performed was found to be important during experiments carried out by the inventors. One approach, which was designed to annihilate the effects of previous thermal treatments, consists of first treating the wafers at a high temperature (of, for example, 1250° C.). This high temperature heating not only destroys all clusters formed in the silicon material, (for example, the clusters formed during the cooling phase of the Czochralski grown silicon rod or during the annealing operation performed to stabilize the resistivity) but also causes outdiffusion of the oxygen atoms. Next, the wafers are heat treated at a lower temperature in the range of 500° C. to 900° C. to consolidate and redistribute the clusters. A disadvantage of this approach is that the first part thereof necessitates a rather high temperature.

A second approach, which makes use of the existing distribution of clusters, consists of essentially performing the above operations in the reverse order. First, the wafers are heat treated at a temperature in the range of 800° to 900° C. to consolidate part of the existing clusters. Next, a second heat treatment at a temperature in the range of 1000° to 1100° C. (somewhat lower than the corresponding temperature in the first part of the previous approach) is accomplished to destroy the clusters near the wafer surface area and cause an outdiffusion of the oxygen to take place in this area.

However, this second approach has proven to be quite unsatisfactory for those wafers in a given batch which contained a small number of clusters—corresponding to the tail of the defect distribution (Gaussian) curves. When used with these wafers, this internal gettering technique, although rendering the wafer quite effective for the purpose of manufacturing unipolar devices, was not effective enough for manufacturing bipolar devices.

Thus, it does not seem feasible to subject all wafers to the same thermal treatment. A thermal treatment specific to each individual wafer and tailored in accordance with the particular application to which the wafer is put to would have to be performed. However, this would necessitate a rather large number of different wafers for each application.

SUMMARY OF THE INVENTION

It is, therefore, an object of this invention to provide a method for standardizing and stabilizing semiconductor wafers (ie., render them exhibit essentially identical wafer characteristics) so that they can be used in both unipolar and bipolar device production lines.

It is another object of this invention to provide a controllable and reproducible method of internally gettering contaminants in semiconductor wafers regardless of their initial characteristics.

It is still another object of this invention to provide a method which is suitable for streamlining semiconductor wafers regardless of their initial oxygen concentration, thereby significantly facilitating procurement of wafers from a number of vendors.

In accordance with the principles of the invention, first the basic required ranges for the defect-free zone thickness and the number of nucleation sites or clusters per unit volume in the wafer is established. For example, the defect-free zone thickness range can be 10–30 $\mu m$ and the range of the number of clusters per unit volume can be $2 \times 10^8 - 2 \times 10^9$ clusters per $cm^3$. Next, the initial oxygen concentration in each of the as-received wafers from various vendors (vendor A, vendor B, etc.) is determined. Based on the initial oxygen concentration, the as-received wafers are grouped into a plurality of lots, each lot representing a predetermined oxygen concentration range. One example of this grouping consists of the ranges 27–30 ppma, 30–33 ppma, 33–36 ppma and 36–39 ppma. Next, the oxygen precipitation rate of the actual amount of wafers corresponding to each lot is determined by subjecting a sample wafer from each lot to a suitable oxygen precipitation treatment. An example of this treatment consists of subjecting the sample wafer in a nitrogen environment to a temperature of about 900° C. for approximately 8 hours. Based on the oxygen precipitation rate, the wafers supplied by each vendor which were previously grouped into lots are now further grouped into classes C1, C2, C3, etc. For example, class C1 may consist of wafers, regardless of their vendor origin, whose oxygen precipitation is low, class C2 may consist of wafers having an intermediate oxygen precipitation rate and class C3 may consist of wafers having a high oxygen precipitation rate. In other words, class C1 may consist of wafers supplied by vendor A and belonging to the lot whose initial oxygen concentration is 30–33 ppma and those supplied by vendor B and belonging to the lot whose initial oxygen concentration is 27–30 ppma, etc.

After classifying all wafers in the above manner, the wafers belonging to each class are subjected to a custom-tailored temperature cycle, also called thermal adaptation cycle herein, to generate the desired cluster density and defect-free zone in each wafer. The cluster generation aspect of this cycle, typically, consists of heating the wafers in a dry oxygen environment to an appropriate unique temperature in the range of about 800° C.–900° C. which is dictated by the particular class of the wafer. The defect-free zone generation aspect consists of heating to a suitable higher temperature in the range of about 1050° C.–1200° C., regardless of the wafer classification, in a suitable environment which promotes outdiffusion of oxygen from the wafer surfaces. One specific example of the thermal adaptation cycle consists of inserting all class C1 wafers into a furnace maintained at a temperature of about 800° C., and then establishing an oxygen environment therein raising the furnace temperature, to a about 900° C. in about 26 minutes. Thereafter, the environment in the furnace is changed to a gaseous mixture of dry oxygen and 1% HCl and the furnace temperature is raised to about 1100° C. in a time of about 30 minutes. All the class C1 wafers are then maintained in these conditions for about 30 minutes. Next, without changing the temperature, the furnace environment is now changed to a gaseous mixture of $N_2$, $O_2$ and HCl in the proportion $N_2:O_2:HCl$ of 97.5%:1.5%:1%. All class C1 wafers are maintained in this environment for about 60 minutes, followed by decreasing the furnace temperature from about 1100° C. to about 1000° C. in a span of about 20 minutes. Thereafter, the atmosphere in the furnace is changed to pure nitrogen and the cooling is continued to about 900° C. in a span of another 20 minutes. Finally, all the class C1 wafers are removed from the furnace.

The thermal adaptation cycle for class C2 wafers consists of initially inserting the class C2 wafers in a furnace at a slightly higher temperature (e.g. 850° C.) than class C1 wafers, followed by ramping the furnace temperature of about 900° C. in a shorter time, for example, of about 13 minutes in the same environment as the case of class C1 wafers. The remainder of the adaptation cycle is essentially identical to that devised for claim C1.

The thermal adaptation cycle for class C3 wafers consists of inserting the class C3 wafers into a furnace at a temperature of about 900° C., maintaining them at this temperature in a dry oxygen environment for about 12–13 minutes followed by ramping the temperature to about 1100° C. in a time of 30 minutes etc., identically as in case of class C2 and class C3 wafers.

Finally, all wafers are cleaned by successively dipping them in diluted hydrofluoric acid, deconized water, chlorinated water, deconized water and Huang solution.

BRIEF DESCRIPTION OF THE DRAWINGS

The novel features and process steps characteristic of the invention are set forth in the appended claims. The invention, however, itself will be understood by reference to the detailed description which follows in conjunction with the accompanying drawings wherein:

DETAILED DESCRIPTION OF A PREFERRED EMBODIMENT

According to the invention, the as-received wafers are first sorted into several classes each comprised of wafers having fairly similar precipitation rates and, consequently, the same initial distribution of clusters. This initial sorting is necessary to standardize the wafers since otherwise, due to the typically wide range of initial oxygen concentration of 26–40 ppma in these wafers, it would be impossible, even if the effects of previous thermal treatments could be eliminated, to achieve an identical distribution of clusters in all the wafers by subjecting them to a common heat treatment.

The invention can be readily incorporated into a production line since the necessary tools for sorting wafers as a function of their initial oxygen concentration without damaging their surfaces are now available.

Figure 2:
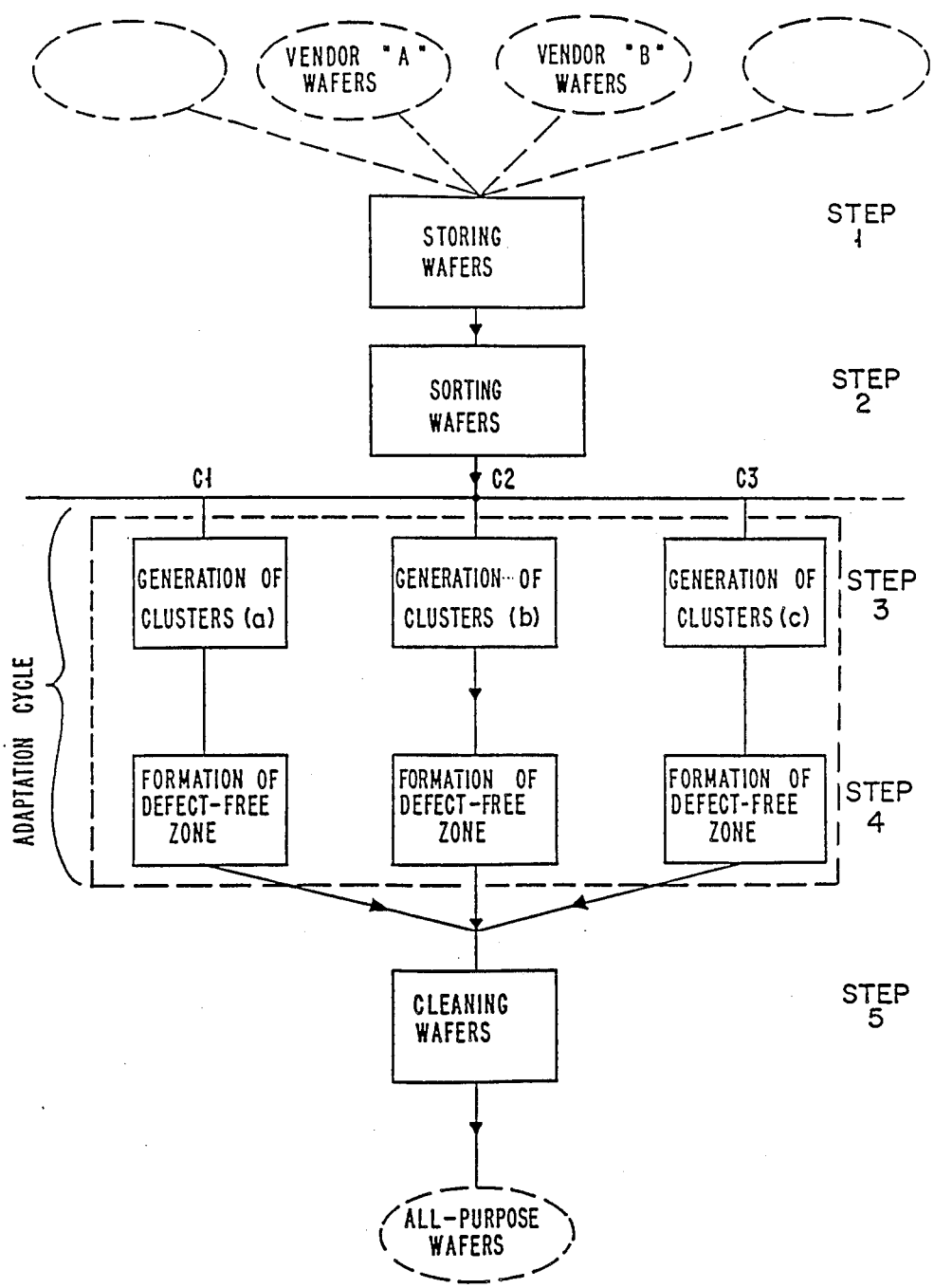
FIG. 2 is a flow diagram illustrating the process steps of the present invention.

Reference is made to FIG. 2 which is a block diagram illustrating the sequence of steps of the present method. In this illustrated embodiment, the wafers to be processed are silicon wafers whose initial oxygen concentration is in the approximate range of 26–40 ppma. Assume that the wafers were supplied by two different vendors A and B, respectively. In step 1, the as-received wafers are identified as to their origin (vendor A or B) and stored prior to being heat-treated.

As mentioned hereinbefore, the kinetics of precipitation of oxygen atoms is governed by the initial oxygen concentration and number of nucleation sites in the wafer. The determination of these parameters and the sorting of the wafers take place in step 2, as will be described in detail hereinbelow.

The initial oxygen concentration in the wafers is measured by Fourier transform infra-red (FTIR) absorption spectrometry at room temperature using the conventional Baker standard:

$$[O]_{ppma} = 9.63\alpha$$

where $\alpha$ is the absorption coefficient at a wavelength of 9 $\mu$m measured in cm$^{-1}$.

The FTIR measurement is carried out quickly to avoid any damage to the surface of the wafers. Typically, the initial oxygen content of the wafers supplied by vendors A and B would be in the ranges of 30–39 ppma and 27–36 ppma. Using the FTIR measurement, the as-supplied wafers of a given vendor are grouped into various lots, each lot corresponding to a narrow range of initial oxygen concentration. Such lots could be formed, for example, on the basis of the following ranges: 27–30 ppma, 30–33 ppma, 33–36 ppma, and 36–39 ppma.

The second parameter (number of nucleation sites in the wafer), does not lend itself to a direct measurement. However, it can be inferred by means of a precipitation test involving a thermal treatment of the wafers by which the oxygen atoms are caused to precipitate upon existing clusters. For purposes of this invention, the amount of precipitated oxygen is regarded as an approximate measure of the number of nucleation sites although the actual number of nucleation sites could be calculated from this amount if desired. The precipitation test are not performed on all wafers, but are limited to a representative sample from each lot.

Figure 3:
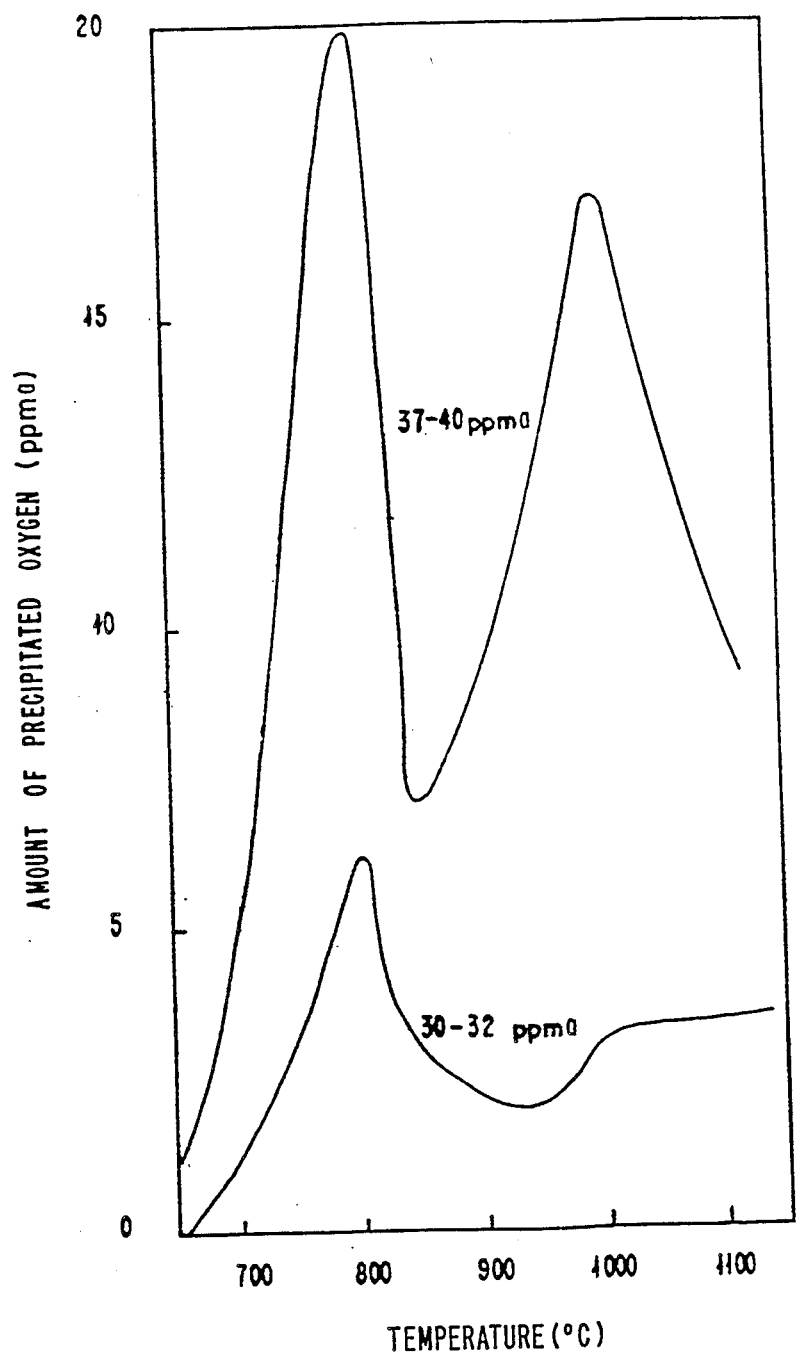
FIG. 3 shows curves representing the variations of the amount of precipitated oxygen with the temperature at which the thermal treatment is performed during a precipitation test performed on wafers having different oxygen content.

The temperature at which the precipitation tests are performed should be sufficiently high to cause little or no generation of clusters, but not too high to destroy the smaller clusters. FIG. 3 shows the amount of oxygen that will precipitate as a function of the temperature at which the thermal treatment is performed in the case of wafers having different oxygen contents. As is clear from FIG. 3, a temperature which is approximately midway between the temperature at which the clusters are generated and that at which a precipitation occurs is suitable for the present purpose. In other words, one possible thermal treatment would be to heat treat the sample wafers at a temperature of about 900° C. in a suitable nitrogen environment such as nitrogen for at least 20 hours.

Although this heat treatment would yield satisfactory results, a temperature treatment for 20 hours or more is quite excessive in practice. An alternative thermal treatment consists of treating the wafers at 900° C. for a short time to enable sufficient cluster growth, followed by a treatment at a higher temperature of about 1100° C. for a longer time. A preferred precipitation treatment consists of a thermal cycle performed in a nitrogen atmosphere consisting of a treatment at about 900° C. for about two hours followed by treatment at a higher temperature of about 1100° C. for a longer time of about 8 hours. This treatment has the advantage of facilitating the detection of change in oxygen content. Since the absorption band of the precipitated oxygen differs from that of the oxygen in solution, the amount of precipitated oxygen can be determined by comparing the levels of the absorption band of the oxygen in solution before and after the precipitation test.

Figure 4:
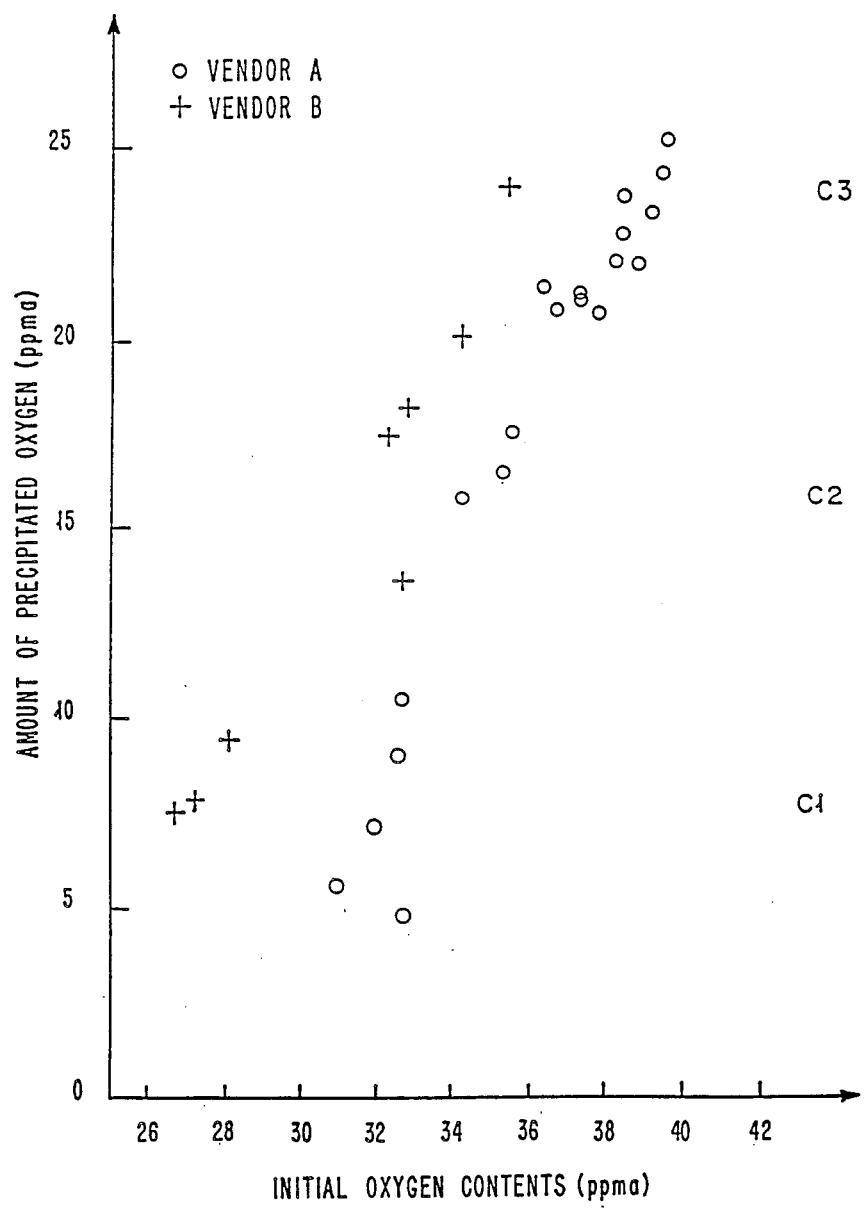
FIG. 4 illustrates dependence of the amount of precipitated oxygen on the initial oxygen content in wafers supplied by different vendors.

FIG. 4 shows the variation in the amount of precipitated oxygen with the initial oxygen content in the sample wafers belonging to three classes C1–C3. The information contained in FIG. 4 can be conveniently summarized as follows:

| Class | Precipitation Rate | Equivalent Amount of Precipitated Oxygen |
|---|---|---|
| C1 | Low | ~0–10 ppma |
| C2 | Intermediate | ~0–20 ppma |
| C3 | High | >20 ppma |

Once the amount of precipitated oxygen and therefore the number of nucleation sites has been determined, the samples used for the precipitation test are discarded.

To complete step 2 of FIG. 2, all wafers from vendors A and B which were previously grouped into different lots in accordance with their initial oxygen content, are now distributed among the three classes C1–C3 in accordance to their amount of precipitated oxygen. Based on the information contained in FIG. 2, a table of data as in Table I is obtained.

TABLE I

| CLASS BASED ON PRECIPITATION RATE | VENDOR | LOTS FORMED ON BASIS OF INITIAL OXYGEN CONTENT (ppma) |
|---|---|---|
| C1 | A | 30–33 |
|    | B | 27–30 |
| C2 | A | 33–36 |
|    | B | 30–33 |
| C3 | A | 36–39 |
|    | B | 33–36 |

As is evident from Table I, a given class may include wafers having different initial oxygen content, but whose precipitation characteristics at a temperature of about 900° C. will be practically identical because such wafers have initial cluster distributions that are quite similar.

If wafers supplied by other vendors than A and B are also involved, the other vendor-supplied wafers can be processed as above by performing the precipitation test on selected samples and sorting the wafers into appropriate classes. Also, the test should be performed on samples on a periodic basis to insure against possible manufacturing changes which might affect the kinetics of precipitation of the oxygen atoms.

In practice, the applicable class (C1, C2, or C3) to which a wafer belongs can be readily ascertained once the vendor and the initial oxygen content in the wafer are known. The main purpose of accomplishing the precipitation test on sample wafers is to provide a safeguard against any possible modifications made to the crystal growing process by the vendor.

To achieve the objective of this invention of supplying production lines with wafers that are both stabilized and standardized, next the desired optimum ranges of defect-free zone thickness and the number of clusters for all wafers are chosen. To meet the silicon requirements for various present and future technologies, the optimum range of defect-free zone thickness is 10–30 $\mu$m, the preferred thickness being at least equal to about 10 $\mu$m and the optimum range of number of clusters is in the range of $2 \times 10^8$ to $2 \times 10^9$ clusters/cm$^3$, the preferred number of clusters being about $5 \times 10^8$ clusters/cm$^3$. These preferred values amount to approximately one cluster per 10 $\mu$m.

In accordance with this invention, the optimum defect free zone thickness and number of clusters in each wafer is established by subjecting the wafers to a thermal cycle, also called adaptation cycle herein. The adaptation cycle comprises two steps, designated as step 3 and step 4 in FIG. 2. Step 3 has been devised to generate the desired number of clusters. Step 4 has been designed to produce both the defect-free zone and consolidate the clusters in the wafer.

Details of one specific manner in which Step 3 may be accomplished are summarized in Table II below. Step 3 may be performed in a programmable furnace. Each of the three classes of wafers is thermally treated separately. As indicated in Table II, initially the wafers belonging to each of the three classes C1–C3 is subjected to a temperature in the range of 800° C. to 900° C. Then, the wafers belonging to classes C1 and C2 are subjected to a higher temperature of about 900° C. by ramping the temperature of the furnace in the specified time periods. In this manner, the wafers having a low amount of precipitated oxygen (class C1) are subjected to a thermal ramping involving a long time, the wafers having an intermediate amount of precipitated oxygen (Class C2) to a temperature ramping involving a short time, and the wafers having the highest precipitated oxygen (Class C3) to no ramping at all. These thermal treatments corresponding to step 3 are all accomplished in a dry oxygen environment.

TABLE II

| CLASS | C1 | C2 | C3 |
|---|---|---|---|
| INITIAL TEMPERATURE | 800° C. | 850° C. | 900° C. |
| THERMAL TREATMENT | Increase temperature to 900° C. in 26 min | Increase temperature to 900° C. in 13 min | Maintain 900° C. for 12 min |
| ATMOSPHERE | Dry O$_2$ | Dry O$_2$ | Dry O$_2$ |

Unlike step 3, step 4 is identical for all wafers, regardless of which class they belong. Since in this step the defect-free zone is formed, a thermal treatment at a high temperature in the range of 1050° C. to 1200° C., the preferred temperature being about 1100° C., in a suitable gaseous atmosphere for a suitable time is necessary. The heating step leading to a temperature rise from 900° C. (at the end of step 3) to 1100° C. (during step 4) has been specifically tailored to consolidate the number of clusters in each wafer and enable stabilization of the wafers. This temperature rise is performed in a dry oxygen atmosphere containing 1% of HCl, with the final temperature being attained in about 30 minutes. Once the final temperature has been attained, to generate the defect-free zones in the wafers by outdiffusion of the oxygen present in the wafer material, the wafers are maintained at 1100° C. in two different atmospheres. First, the wafers are maintained in dry oxygen containing 1% of HCl for about 30 minutes. During this step an oxide layer is grown on the wafer surfaces. Then, the wafers are maintained in an atmosphere containing a mixture of N$_2$/O$_2$/HCl in the respective proportion of 97.5%, 1.5% and 1%, for about 60 minutes as graphically illustrated in FIG. 5.

Figure 5:
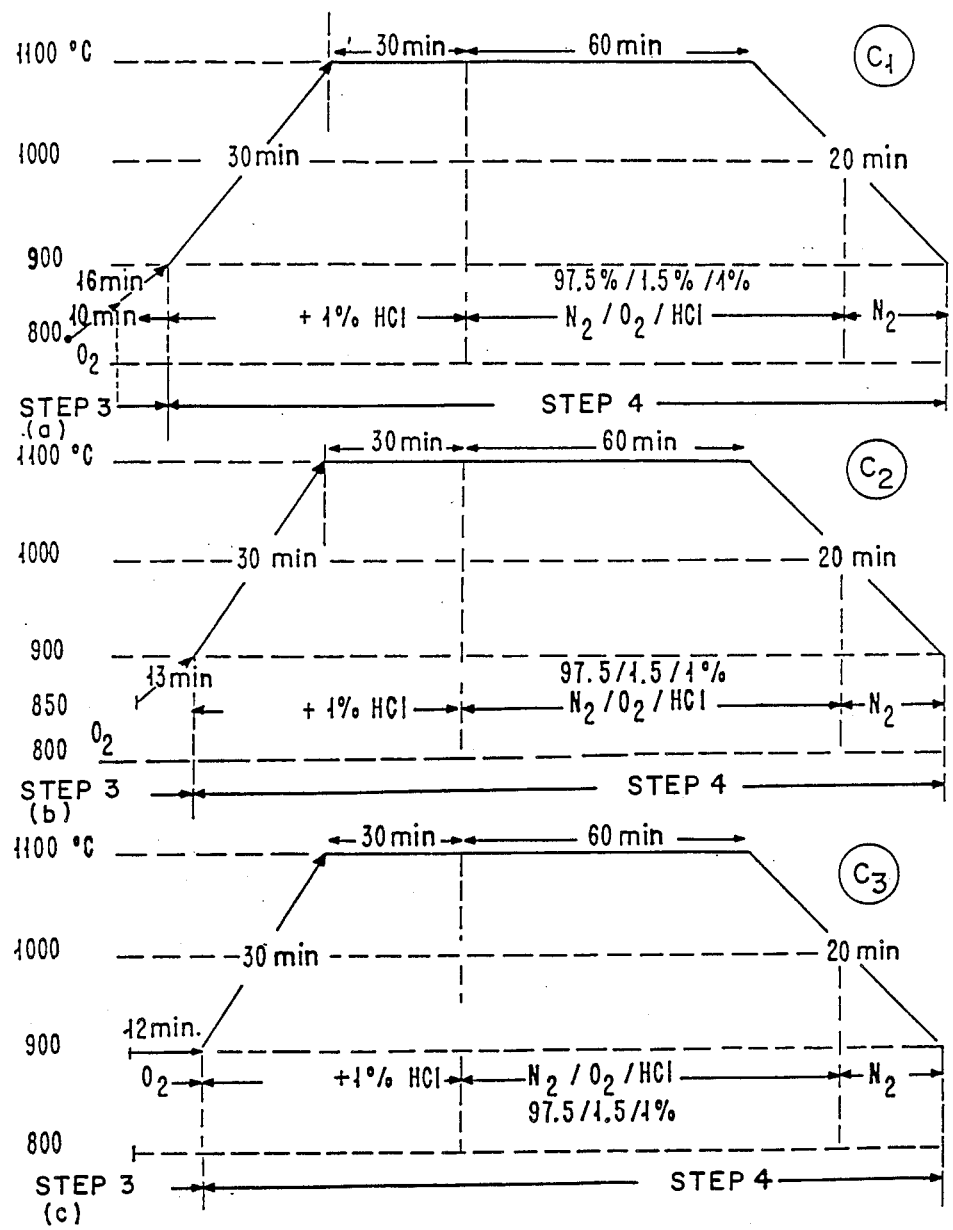
FIG. 5 is a schematic illustration of the details of the thermal adaptation cycle of FIG. 2 for each of the three classes of wafers.

Continuing with Step 4, as indicated in FIG. 5, next the temperature of the furnace is decreased from about 1000° C. in about 20 minutes in the N$_2$/O$_2$/HCl gaseous atmosphere followed by cooling the wafers from 1000° C. in 20 minutes in an atmosphere of N$_2$, and eventual removal of the wafers from the furnace once the temperature of 900° C. has been reached. The cooling of wafers from 1100° C. to 900° C. is accomplished with care avoiding any warpage of the wafers.

The selection of the above gaseous atmospheres has been made after careful testing and taking into consideration the fact that the risks of contamination at the high temperature of 1100° C. are far from negligible and that the generation of surface stacking faults reaches a maximum at that temperature so as to minimize these risks.

Details of the manner in which step 4 may be accomplished are summarized in Table III below. The step 4 treatments is common to all wafers irrespective of the class to which they belong.

TABLE III

| INITIAL TEMPERATURE | 900° C. |
|---|---|
| THERMAL TREATMENT | 1. Increase temperature to 1100° C. in 30 min |
| | 2. Maintain temperature at 1100° C. for 30 min |
| | 3. Maintain temperature at 1100° C. for 60 min |
| | 4. Decrease temperature to 1000° C. in 20 min |
| | 5. Decrease temperature to 900° C. in 20 min |
| ATMOSPHERE | 1 and 2: dry O$_2$ + 1% HCl |
| | 3 and 4: N$_2$/O$_2$/HCl in the proportion of 97.5%/1.5%/1% |
| | 5: N$_2$ |

The final step (step 5, FIG. 2) of the present process is cleaning. This is accomplished by successively dipping the thermally treated wafers successively in a diluted HF solution, deionized water, chlorinated water (to render the wafers hydrophilic), deionized water again, and Huang solution.

The wafers thus obtained can be used on both unipolar and bipolar device production lines. Since the wafers after the present treatment contain the desired number of consolidated clusters, they are fully stabilized. As a result of this stabilization, the wafers are rendered less sensitive to variations in the manufacturing processes characteristic of unipolar or bipolar device production lines. Another advantage of the present method is that it is tailored to individual wafers, regardless of their origin and wafer characteristics. Consequently, supplies from various vendors can be obtained in a more flexible and economical manner.

While the present method as discussed above is primarily intended to deal with wafers whose initial oxygen content is within the range of 26-40 ppma, it could be adapted to the situations where the initial oxygen content is outside that range by appropriately modifying the thermal treatments. For example, if the initial oxygen content exceeds 40 ppma, then step 3 (in which cluster generation takes place) is eliminated, and step 4 (in which both the formation of the defect-free zone and the clusters takes place) is accomplished as described hereinabove by using an initial insertion temperature of about 900° C. If the oxygen content is less than 26 ppma, then the duration of step 3 is increased for example, from 26 minutes to about 60 minutes as in step 3(a) of FIG. 5, with step 4 remaining unchanged.

CHARACTERIZATION

In order to determine whether the objects of the invention have been attained, silicon wafers which were subjected to the thermal steps illustrated in FIGS. 2 and 5 were analyzed by studying the wafer's surface condition, plastic distortion, stability of oxygen solution, number of clusters generated, defect-free zone thickness and electrical characteristics of the defect-free zone.

(a) Surface condition

To ascertain the surface condition of the wafers, not only the thickness of the oxide layer, but also its variation $\Delta e$ was measured by ellipsometry. The measured thickness ranged from 109.7-116.4 nm which $\Delta e$ was in the range of 0.7-1.7 nm.

Upon deoxidation, the wafer surfaces showed no evidence of any abnormal conditions, except for a few small stacking faults confined to a band of less than 1 nm width along the periphery of the wafer.

Visual inspection of the wafers both before and after deoxidation indicated that the wafer surface condition was within the desired specification limit.

(b) Plastic distortion

Bow measurements made prior to and after the present heat treatment showed no evidence of plastic distortion (i.e., warping) of the wafers as a result of the thermal cycle.

X-ray topography analysis did not reveal any dislocations whatsoever.

(c) Stability of oxygen solution

To ascertain whether or not the oxygen solution was stable, a thermal treatment at a temperature of 750° C. was performed on the wafers. If the oxygen solution in the wafers was unstable, then this treatment would have caused the resistivity to vary due to the generation of donors. No such variation was observed, thereby demonstrating that the oxygen solution was stabilized.

(d) Number of clusters generated

The variation of the oxygen content in the wafers treated in accordance with the invention was found to be minimal. A thermal anneal treatment at a temperature of 1050° C. was performed for a period of about 24 hours to cause a substantial precipitation to occur upon the stabilized clusters. From the quantity of precipitated oxygen, the number of precipitation clusters per cm$^3$ was calculated using the following expression derived from Ham's law:

$$N_p = 2.3 \times 10^{-4} \times D^{-3/2} \times \tau^{-3/2} \times C^{-1/2}$$

where
D is the diffusion coefficient of oxygen at 1050° C.,
C is the residual oxygen concentration, and
$\tau$ is the incubation time of the precipitation process given by the following expression:

$$\tau = \frac{t}{\text{Log}\left(\frac{C_O - C_L}{C - C_L}\right)}$$

where
$C_O$ is the initial oxygen concentration,
$C_L$ is the limit of solubility at the applicable temperature (here $C_L = 8$ ppma) and
t is the duration of the treatment.

The number of clusters generated in wafers of all three classes subjected to the full thermal cycle was calculated. Table IV below shows representative results that were obtained.

TABLE IV

| CLASS | $C_O$ (ppma) | C (ppma) | Np ($10^8$/cm$^{-3}$) |
|---|---|---|---|
| C1 | 28.6 | 20.0 | 6.3 |
|  | 29.5 | 21.9 | 4.7 |
|  | 29.7 | 21.7 | 4.7 |
| C2 | 31.2 | 22.5 | 4.4 |
|  | 31.8 | 22.7 | 4.6 |
|  | 32.6 | 21.8 | 6.4 |
| C3 | 33.5 | 23.5 | 2.4 |
|  | 34.0 | 19.2 | 5.8 |
|  | 35.7 | 18.8 | 7.0 |

The calculated values were found to be in good agreement with the actual count of the observed etch pits subsequent to lapping and chemical surface revelation.

(e) Thickness of the defect-free zone

Figure 1:
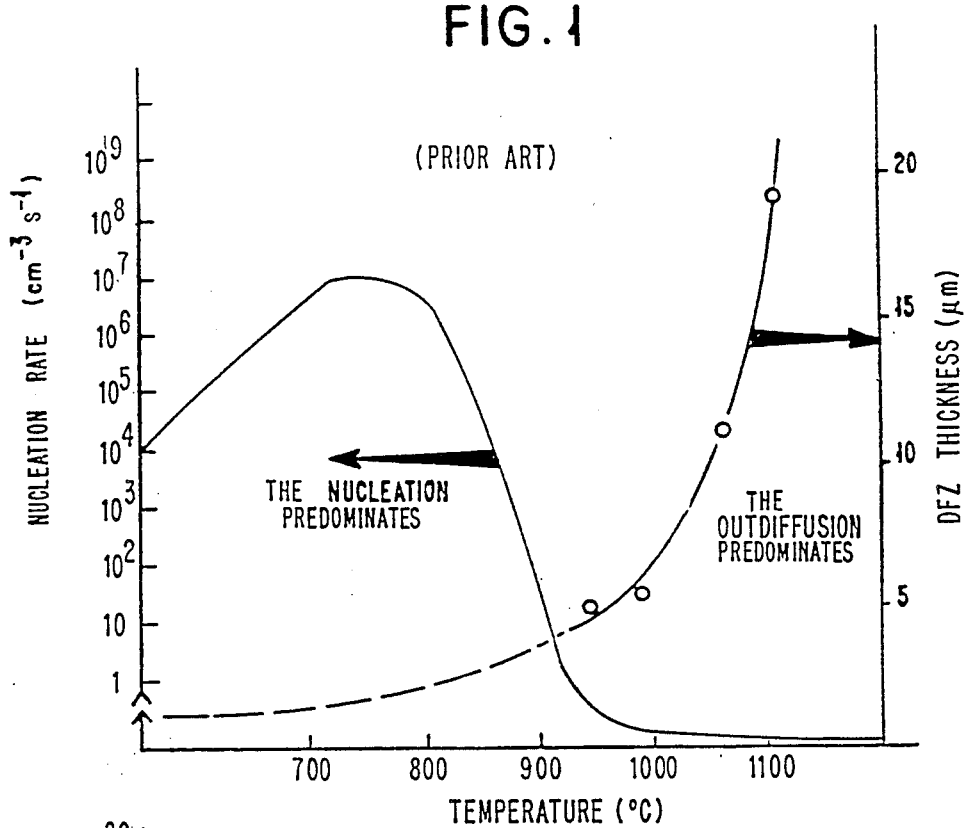
FIG. 1 is a graphical representation of the dependence of the nucleation rate and of the thickness of the defect-free zone on the temperature at which the thermal treatment is performed.
Figure 6:
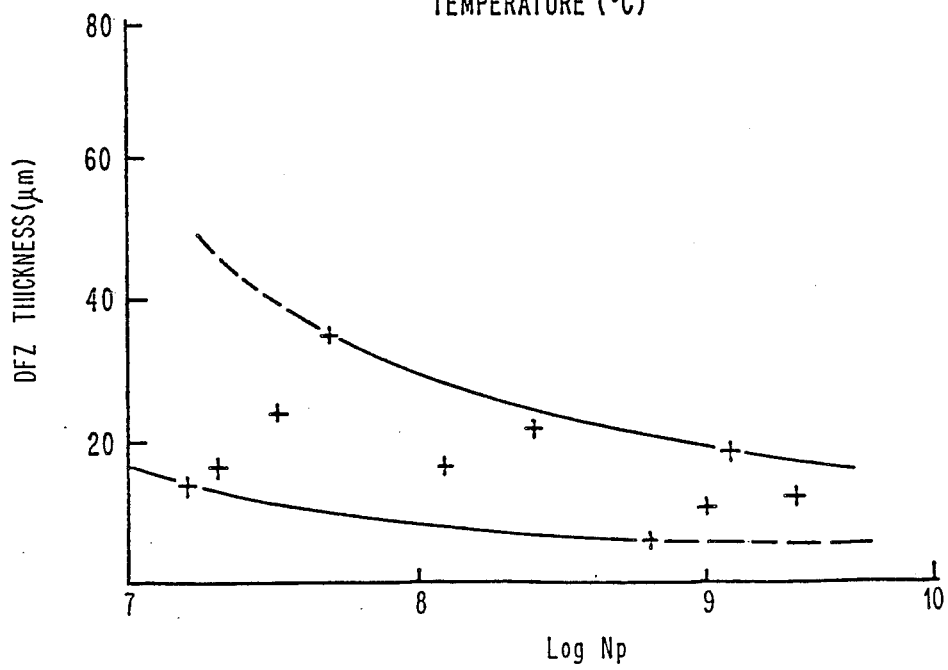
FIG. 6 is a curve representing variation of the thickness of the defect-free zone with the number of clusters generated.

Using the bevel technique, a measurement of the defect-free thickness zone in wafers annealed at 1050° C. for 24 hours was accomplished. This measurement was done after the annealing operation since the defects obtained prior to the annealing operation were too small to be seen. The curve of FIG. 6 represents the measured variation of the defect-free zone with the number of clusters generated. As shown in FIG. 6, the wafers contained a defect-free zone of at least 10 $\mu$m thickness for the clusters involved.

(f) Electrical properties of the defect-free zone (MOS Test)

The electrical properties of the defect-free zone within a zone of a few microns thick below the surface of the wafer were evaluated by forming a MOS capacitor and studying its transient response by quickly switching from the accumulation mode to the inversion mode. No particular problems were found in the case of pre-treated wafers. Tests of such a structure on a beveled wafer showed that the life of the carriers decreased as one moved away from the surface of the wafer, thereby indicating the presence of a gradient of defects.

While the invention has been particularly shown and described with reference to a preferred embodiment thereof, it will be understood by those skilled in the art that numerous changes in form and detail may be made therein without departing from the spirit and scope of the invention.

We claim:

1. A method of standardizing and stabilizing semiconductor wafers supplied by a plurality of vendors for use in unipolar and bipolar device manufacture, said method comprising:
   (a) sorting said wafers into a plurality of classes in accordance with the oxygen precipitation rate of said wafers and retaining all of said wafers; and
   (b) generating in each of said wafers (1) clusters of a concentration corresponding to a predetermined cluster concentration range and (2) a defect-free zone of a thickness corresponding to a predetermined defect-free zone thickness by subjecting the wafers to a thermal adaptation cycle, said thermal adaptation cycle being different for different classes of wafers.

2. The method as in claim 1, wherein said semiconductor is silicon.

3. The method as recited in claim 2, wherein said cluster concentration range is approximately $2 \times 10^8$–$2 \times 10^9$ clusters/cm$^3$.

4. The method as recited in claim 3, wherein said defect-free zone thickness range is approximately 10–30 μm.

5. The method as recited in claim 4, further comprising sorting the wafers supplied by a given vendor into a plurality of lots in accordance with the initial oxygen concentration range in said wafers, each of said lots corresponding to a narrow initial oxygen concentration range.

6. The method as recited in claim 4, further comprising sorting the wafers supplied by a given vendor into lots in accordance with the initial oxygen concentration ($O_i$) in said wafers as follows:
   lot 1: wafers having $O_i <$ approximately 26 ppma
   lot 2: wafers having an $O_i$ in the range of approximately 27–30 ppma
   lot 3: wafers having an $O_i$ in the range of approximately 30–33 ppma
   lot 4: wafers having an $O_i$ in the range of approximately 36–39 ppma
   lot 5: wafers having an $O_i <$ of approximately 40 ppma.

7. The method as recited in claim 6, further comprising:
   (a) determining the oxygen precipitation rate of wafers corresponding to said lots 2, 3 and 4 by subjecting a representative wafer from each of said lots 2, 3 and 4 to a thermal treatment; and
   (b) grouping the wafer lots corresponding to all vendors into a plurality of classes based on the oxygen precipitation rate.

8. The method as recited in claim 7, wherein said thermal treatment comprises heating in an nitrogen environment to a temperature of about 900° C. for a time in excess of about 20 hours.

9. The method as recited in claim 7, wherein said thermal treatment comprises heating said representative wafers to a temperature of about 900° C. for a time of about 2 hours followed by heating to a temperature of about 1100° C. for a time of about 8 hours.

10. The method as recited in claim 7, wherein said classes comprise:
    a first class (C1) corresponding to a relatively low oxygen precipitation rate;
    a second class (C2) corresponding to a relatively intermediate oxygen precipitation rate; and
    a third class (C3) corresponding to a relatively high oxygen precipitation rate.

11. The method as recited in claim 7, said adaptation cycle comprises heating said wafers to a temperature in the range of about 800°–900° C. to generate said clusters and heating said wafers to a temperature in the range of about 1050°–1200° C. to generate said defect-free zone.

12. The method as recited in claim 10, said thermal adaptation cycle comprises:
    (a) inserting said class C1 wafers in to a furnace maintained at a temperature of about 800° C.;
    (b) establishing a dry oxygen environment in said furnace; and
    (c) increasing the furnace temperature to about 900° C. in a time of about 26 minutes,
    whereby clusters of a concentration lying within said predetermined cluster concentration range are generated in said class C1 wafers.

13. The method as recited in claim 10, said thermal adaptation cycle comprises:
    (a) inserting said class C2 wafers into a furnace maintained at a temperature of about 850° C.;
    (b) establishing a dry oxygen environment in said furnace; and
    (c) increasing said furnace temperature to about 900° C. in a time of about 13 minutes,
    whereby clusters of a concentration lying within said predetermined cluster concentration range are generated in said class C2 wafers.

14. The method as recited in claim 10, said thermal adaptation cycle comprises:
    (a) inserting said class C3 wafers into a furnace maintained at a temperature of about 900° C.;
    (b) establishing a dry oxygen environment in said furnace; and
    (c) maintaining said class C3 wafers in said furnace for a time of about 12 minutes,
    whereby clusters of a concentration lying within said predetermined cluster concentration range are generated in said class C3 wafers.

15. The method as recited in claim 12, said adaptation cycle further comprises:
    (a) changing said oxygen environment in said furnace to an environment consisting of a mixture of oxygen and 1% HCl;
    (b) raising the temperature of said furnace to about 1100° C. in a span of about 30 minutes;
    (c) maintaining said class C1 wafers in said oxygen and 1% HCl environment at said about 1100° C. temperature for about 30 minutes;
    (d) replacing said oxygen and 1% HCl environment with an environment consisting of $N_2$, $O_2$ and HCl in the proportion of 97.5% $N_2$, 1.5% $O_2$ and 1% HCl;
    (e) maintaining said class C1 wafers in said $N_2/O_2/HCl$ environment at said approximately 1100° C. temperature for a time of about 60 minutes;
    (f) decreasing the temperature of said furnace to about 1000° C. in a time of about 20 minutes;

(g) replacing said $N_2/O_2/HCl$ environment with $N_2$ environment; and (h) decreasing the temperature of said furnace to about 900° C.

whereby is formed in said class C1 wafers a defect-free zone of a thickness lying within said predetermined defect-free zone thickness range.

16. The method as recited in claim 13, said adaptation cycle further comprises:

(a) changing said oxygen environment in said furnace to an environment consisting of a mixture of oxygen and 1% HCl;

(b) raising the temperature of said furnace to about 1100° C. in a span of about 30 minutes;

(c) maintaining said class C2 wafers in said oxygen and 1% HCl environment at said about 1100° C. temperature for about 30 minutes;

(d) replacing said oxygen and 1% HCl environment with an environment consisting of $N_2$, $O_2$ and HCl in the proportion of 97.5% $N_2$, 1.5% $O_2$ and 1% HCl.

(e) maintaining said class C2 wafers in said $N_2/O_2/HCl$ environment at said approximately 1100° C. temperature for a time of about 60 minutes.

(f) decreasing the temperature of said furnace to about 1000° C. in a time of about 20 minutes;

(g) replacing said $N_2/O_2/HCl$ environment with $N_2$ environment; and (h) decreasing the temperature of said furnace to about 900° C., whereby is formed in said class C2 wafers a defect-free zone of a thickness lying within said predetermined defect-free zone thickness range.

17. The method as recited in claim 14, said adaptation cycle further comprises:

(a) changing said oxygen environment in said furnace to an environment consisting of a mixture of oxygen and 1% HCl;

(b) raising the temperature of said furnace to about 1100° C. in a span of about 30 minutes;

(c) maintaining said class C3 wafers in said oxygen and 1% HCl environment at said about 1100° C. temperature for about 30 minutes;

(d) replacing said oxygen and 1% HCl environment with an environment consisting of $N_2$, $O_2$ and HCl in the proportion of 97.5% $N_2$, 1.5% $O_2$ and 1% HCl;

(e) maintaining said class C3 wafers in said $N_2/O_2/HCl$ environment at said approximately 1100° C. temperature for a time of about 60 minutes;

(f) decreasing the temperature of said furnace to about 1000° C. in a time of about 20 minutes;

(g) replacing said $N_2/O_2/HCl$ environment with $N_2$ environment; and (h) decreasing the temperature of said furnace to about 900° C., whereby is formed in said class C3 wafers a defect-free zone of a thickness lying within said predetermined defect-free zone thickness range.

18. The method as recited in claim 7, said adaptation cycle for said lot 5 comprises heating said wafers corresponding to lot 5 to temperature in the range of approximately 1050° to 1200° C., thereby forming said defect-free zone and consolidating clusters present in said lot 5 wafers.

19. The method as recited in claim 7, said adaptation cycle for said lot 1 comprising:

(a) heating said wafers corresponding to lot 1 to a temperature in the range of about 800°–900° C. for a time of about an hour, thereby generating said clusters; and (b) heating said wafers corresponding to lot 1 to a temperature in the range of about 1050°–1200° C., thereby generating said defect-free zone and consolidating said clusters.

20. A method for standardizing and stabilizing silicon semiconductor wafers supplied by a plurality of vendors for use in unipolar and bipolar device manufacture, said method comprising:

(a) sorting said wafers into a plurality of classes in accordance with the oxygen precipitation rate of said wafers and retaining all of said wafers;

(b) generating in each of said wafers (1) clusters of a concentration in the range of approximately $2 \times 10^8 - 2 \times 10^9$ clusters/cm$^3$ and (2) a defect-free zone of a thickness in the range of approximately 10–30 μm by subjecting said classes of wafers to a thermal adaptation cycle, said thermal adaptation cycle being different for different classes of wafers, but identical to wafers of a given class.

* * * * *